United States Patent
Chu

(10) Patent No.: US 12,278,137 B2
(45) Date of Patent: Apr. 15, 2025

(54) MANUFACTURING METHOD OF SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Zhugen Chu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 484 days.

(21) Appl. No.: 17/453,881

(22) Filed: Nov. 8, 2021

(65) Prior Publication Data
US 2022/0270916 A1    Aug. 25, 2022

Related U.S. Application Data

(63) Continuation of application No. PCT/CN2021/111882, filed on Aug. 10, 2021.

(30) Foreign Application Priority Data

Feb. 25, 2021  (CN) .......................... 202110212376.9

(51) Int. Cl.
H01L 21/762     (2006.01)
H10D 62/10      (2025.01)

(52) U.S. Cl.
CPC ..... *H01L 21/76224* (2013.01); *H10D 62/115* (2025.01)

(58) Field of Classification Search
CPC ....... H01L 21/315653; H01L 21/76224; H01L 29/0649; H01L 21/027771;
(Continued)

(56) References Cited

U.S. PATENT DOCUMENTS 6,077,784 A    6/2000 Wu et al.
6,828,226 B1   12/2004 Chen et al.
(Continued)

FOREIGN PATENT DOCUMENTS

CN       1399314 A     2/2003
CN     101459111 A     6/2009
(Continued)

OTHER PUBLICATIONS

International Search Report cited in PCT/CN2021/111882, mailed Nov. 26, 2021, 9 pages.
(Continued)

*Primary Examiner* — Douglas W Owens
(74) *Attorney, Agent, or Firm* — Kilpatrick Townsend & Stockton LLP

(57) ABSTRACT

The present disclosure provides a manufacturing method of a semiconductor structure, and a semiconductor structure. The manufacturing method of a semiconductor structure includes: providing a substrate, where a functional structure layer is formed on a surface of the substrate, and particles are provided on the surface of the functional structure layer; forming a first dielectric layer on the surface of the substrate, where the first dielectric layer covers the functional structure layer; grinding to remove part of the first dielectric layer until the particles are exposed, and removing the particles, to form first recesses on a surface of the remaining first dielectric layer; and forming a second dielectric layer on the surface of the first dielectric layer, where the second dielectric layer fills the first recesses.

17 Claims, 2 Drawing Sheets

(58) Field of Classification Search
CPC ......... H01L 21/02216; H01L 21/02164; H01L 21/02271; H01L 21/31053
USPC .......................................... 257/506; 438/207
See application file for complete search history.

(56) References Cited

U.S. PATENT DOCUMENTS

| | | |
|---|---|---|
| 6,855,617 B1 | 2/2005 | Lu et al. |
| 2002/0068435 A1 | 6/2002 | Tsai et al. |
| 2016/0064241 A1* | 3/2016 | Wu et al. .......... H01L 21/30625 |
| 2020/0243376 A1* | 7/2020 | Ku ........................ H10B 12/09 |

FOREIGN PATENT DOCUMENTS

| | | | |
|---|---|---|---|
| CN | 104112699 | A | 10/2014 |
| CN | 113035769 | A | 6/2021 |
| TW | 481858 | A | 4/2002 |
| TW | 497213 | B | 8/2002 |
| TW | 525242 | B | 3/2003 |

OTHER PUBLICATIONS

First Office Action cited in CN202110212376.9, mailed May 17, 2022, 14 pages.

* cited by examiner

MANUFACTURING METHOD OF SEMICONDUCTOR STRUCTURE AND SEMICONDUCTOR STRUCTURE

CROSS-REFERENCE TO RELATED APPLICATIONS

The present disclosure is a continuation application of International Patent Application No. PCT/CN2021/111882, filed on Aug. 10, 2021 and titled "MANUFACTURING METHOD OF SEMICONDUCTOR STRUCTURE AND SEMICONDUCTOR STRUCTURE", which claims the priority of Chinese Patent Application No. 202110212376.9, titled "MANUFACTURING METHOD OF SEMICONDUCTOR STRUCTURE AND SEMICONDUCTOR STRUCTURE" and filed on Feb. 25, 2021. The entire contents of International Patent Application No. PCT/CN2021/111882 and Chinese Patent Application No. 202110212376.9 are incorporated herein by reference.

TECHNICAL FIELD

The present disclosure relates to the technical field of semiconductors, and in particular to a manufacturing method of a semiconductor structure and a semiconductor structure.

BACKGROUND

With the development of semiconductor production towards ultra-large-scale integrated circuits, the integration density of integrated circuits is increasing, and the spacing between adjacent metal lines is decreasing, which poses stricter restrictions on various types of defects. In the subsequent dielectric layer filling process, bump or void defects may occur at the interface due to the limitations of the process, which seriously affects the reliability and service life of the semiconductor devices.

In the process of forming a functional structure layer of a semiconductor device, the surface of the functional structure layer is prone to particles due to the limitation of the forming process. As a result, after a dielectric layer is formed by depositing a dielectric material on the surface of the functional structure layer, larger bumps will be formed on the surface of the dielectric layer due to the presence of the particles. Moreover, due to the high integration of the devices, the functional structure layer is relatively wide and deep, and the hole-filling capability of the ordinary deposition process is not sufficient. Thus, a void may be formed between adjacent wafers of the functional structure layer, which reduces the reliability and service life of the semiconductor structure.

SUMMARY

According to an aspect, embodiments of the present disclosure provide a manufacturing method of a semiconductor structure, including: providing a substrate, where a functional structure layer is formed on a surface of the substrate, and particles exist on the surface of the functional structure layer; forming a first dielectric layer on the surface of the substrate, where the first dielectric layer covers the functional structure layer; grinding to remove part of the first dielectric layer until the particles are exposed, and removing the particles, to form first recesses on a surface of the remaining first dielectric layer; and forming a second dielectric layer on the surface of the first dielectric layer, where the second dielectric layer fills the first recesses.

According to another aspect, embodiments of the present disclosure provide a semiconductor structure, including a substrate, a functional structure layer, a first dielectric layer, and a second dielectric layer, where the functional structure layer is provided on the surface of the substrate; the functional structure layer includes a plurality of functional units arranged at intervals, and a gap is provided between two adjacent functional units; the first dielectric layer is provided in each gap and is located on the surface of the functional structure layer; first recesses and second recesses are provided on the surface of the first dielectric layer; each of the second recesses is located above the gap; the second dielectric layer is provided on the surface of the first dielectric layer and fills the first recesses and the second recesses.

DETAILED DESCRIPTION

Figure 1:
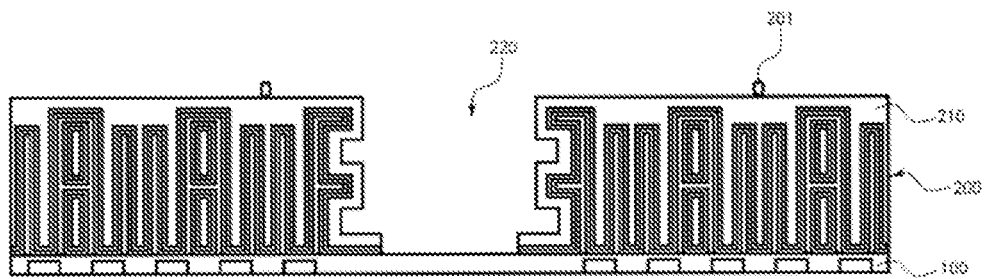
FIG. 1 to FIG. 6 are schematic structural diagrams of a semiconductor structure in multiple steps of a manufacturing method of a semiconductor structure according to an exemplary embodiment.

Exemplary embodiments will be described below in further detail with reference to the accompanying drawings. The exemplary embodiments may be implemented in various forms, and may not be construed as being limited to those described herein. On the contrary, these embodiments are provided to make the present disclosure comprehensive and complete and to fully convey the concept manifested therein to those skilled in the art. The same reference numerals in the figures indicate the same or similar structures, and thus their detailed descriptions will be omitted.

FIG. 1 to FIG. 6 representatively show the schematic diagrams of a semiconductor structure in multiple steps of a manufacturing method of a semiconductor structure proposed by the present disclosure. In the exemplary embodiment, the manufacturing method of a semiconductor structure proposed by the present disclosure is described by taking its application to a transistor-controlled digital microsignal memory as an example. It is understandable for those skilled in the art that, in order to apply the relevant design of the present disclosure to other types of semiconductor devices or other semiconductor structures, various modifications, additions, substitutions deletions or other changes may be made to the following specific embodiments, but such changes are still within the scope of the principle of the manufacturing method of a semiconductor structure proposed by the present disclosure.

As shown in FIG. 1 to FIG. 6, in this embodiment, the manufacturing method of a semiconductor structure proposed by the present disclosure includes at least the following steps:

providing a substrate 100, where a functional structure layer 200 is formed on the surface of the substrate 100, and particles 201 exist on the surface of the functional structure layer 200;

forming a first dielectric layer 300 on the surface of the substrate 100, where the first dielectric layer 300 covers the functional structure layer 200;

grinding to remove part of the first dielectric layer 300 until the particles 201 are exposed, and removing the particles 201, to form first recesses 330 on the surface of the remaining first dielectric layer 300; and forming a second dielectric layer 400 on the surface of the first dielectric layer 300, where the second dielectric layer 400 fills the first recesses 330.

The present disclosure proposes a manufacturing method of a semiconductor structure, including forming the first dielectric layer 300 on the functional structure layer 200, grinding the first dielectric layer 300 to remove the particles, and forming the second dielectric layer 400 on the first dielectric layer 300 such that the second dielectric layer 400 completely fills the first recesses 330. By the above process design, the manufacturing method of a semiconductor structure proposed by the present disclosure can avoid bump and void defects between adjacent functional structure layers, thereby improving the reliability and service life of the semiconductor structure, and achieving the advantages that the process is simple and easy to control.

FIG. 1 representatively shows a schematic structural diagram of a semiconductor structure in the step of "providing a substrate 100". Specifically, in the above step, the semiconductor structure includes the substrate 100 and the functional structure layer 200. The functional structure layer 200 is formed on the surface of the substrate 100, and the functional structure layer 200 may include functional units 210, such as capacitors. Due to the limitations of the process for forming the functional structure layer 200, there may be particles 201 on the surface of the functional structure layer 200.

Figure 2:
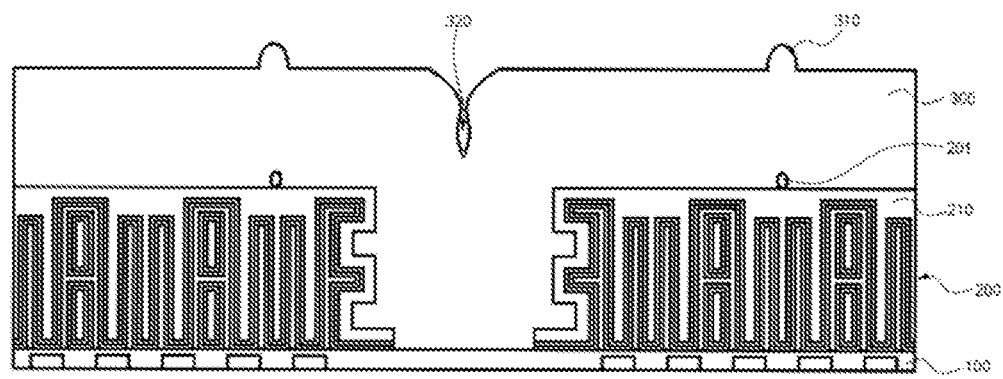

FIG. 2 representatively shows a schematic structural diagram of the semiconductor structure in the step of "forming a first dielectric layer 300". Specifically, in the above step, the semiconductor structure includes the substrate 100, the functional structure layer 200, and the first dielectric layer 300. The first dielectric layer 300 is formed on the surface of the substrate 100 and covers the functional structure layer 200. During formation of the first dielectric layer 300, due to the presence of the particles 201 on the surface of the functional structure layer 200, the surface of the first dielectric layer 300 has corresponding bumps 310 above the particles 201.

Further, in this embodiment, a material of the first dielectric layer 300 may include an oxide, such as $SiO_2$, etc.

Further, in this embodiment, a forming process of the first dielectric layer 300 may include a chemical vapor deposition (CVD) process.

Figure 3:
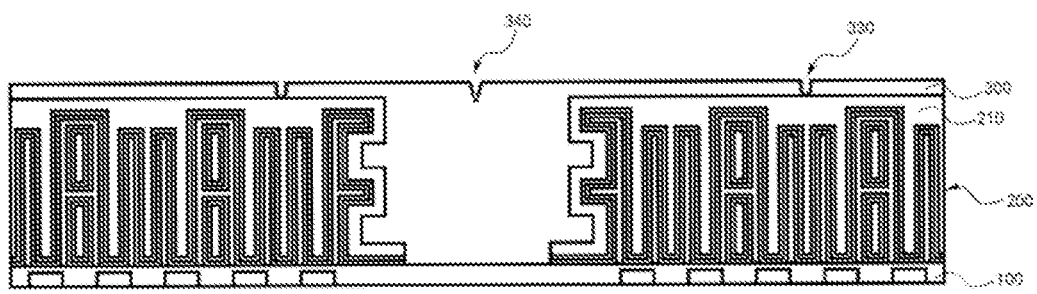

FIG. 3 representatively shows a schematic structural diagram of the semiconductor structure in the step of "grinding to remove part of the first dielectric layer 300". Specifically, in the above step, the semiconductor structure includes the substrate 100, the functional structure layer 200, and the remaining first dielectric layer 300 after grinding. The first dielectric layer 300 can be ground to the extent that the particles 201 are exposed. Therefore, the particles 201 can be removed during the grinding process, thereby forming first recesses 330 on the surface of the remaining first dielectric layer 300 by removing the particles 201.

Further, in this embodiment, the grinding process for removing part of the first dielectric layer 300 may include a chemical mechanical polishing (CMP) process.

Further, in this embodiment, the remaining first dielectric layer 300 after grinding may have a thickness of 100 nm to 200 nm, such as 100 nm, 130 nm, 150 nm, 200 nm, etc. In other embodiments, the thickness of the remaining first dielectric layer 300 after grinding may be less than 100 nm, or greater than 200 nm, such as 95 nm, 210 nm, etc., which is not limited to this embodiment.

In one of the embodiments, as shown in FIG. 1 to FIG. 6, in this embodiment, the functional structure layer 200 may include a plurality of functional units 210 arranged at intervals, where a gap 220 is provided between two adjacent functional units 210. On this basis, the first dielectric layer 300 is formed on the surface of the substrate 100, covering the functional structure layer 200 and filling each gap 220. On this basis, during the formation of the first dielectric layer 300, in addition to the bumps 310, the surface of the formed first dielectric layer 300 also has corresponding voids 320 located roughly above the gaps 220, due to the presence of the particles 201 and the gaps 220. In other embodiments, when the functional structure layer 200 is an integrated device structure, i.e., when the functional structure layer 200 does not have the gaps 220, there may be no void 320 in the first dielectric layer 300 covering the surface of the functional structure layer 200. Furthermore, when the surface of the first dielectric layer 300 further has voids 320, the depth of the void 320 is partially coincident with the second recess 340 in the thickness direction according to the principle that the void 320 is formed under the influence of the gap 220. Accordingly, when the first dielectric layer 300 is ground until the particles 201 are exposed to form the first recess 330, the voids 320 are also exposed by the surface of the remaining of the first dielectric layer 300, thus forming the second recesses 340.

Figure 4:
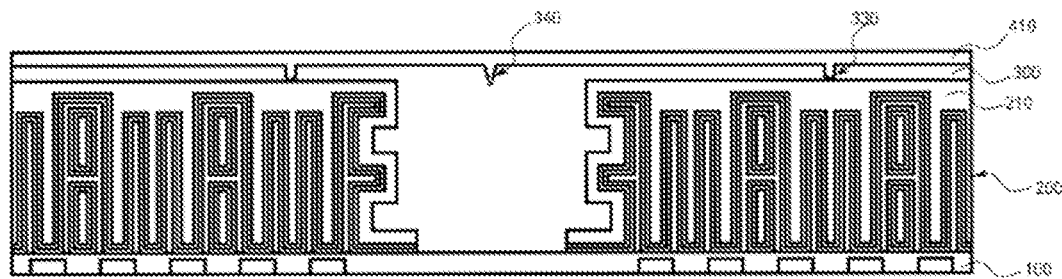
Figure 5:
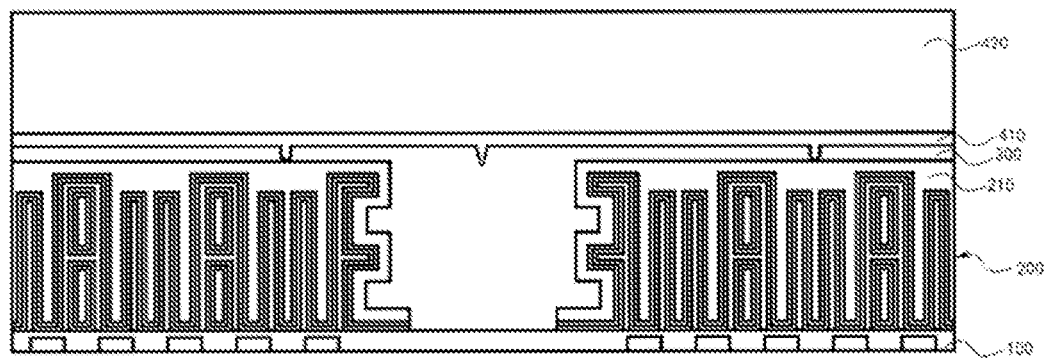

In one of the embodiments, as shown in FIG. 4 and FIG. 5, in this embodiment, the step of "forming a second dielectric layer 400 on the surface of the first dielectric layer 300" may specifically include the following steps:

depositing a silicon precursor on the surface of the first dielectric layer 300 at a first deposition rate to form a first dielectric material layer 410, where the first dielectric material layer 410 fills the first recesses 330; and depositing the silicon precursor on the surface of the first dielectric material layer 410 at a second deposition rate to form a second dielectric material layer 420, where the second deposition rate is greater than the first deposition rate.

FIG. 4 representatively shows a schematic structural diagram of the semiconductor structure in the step of "forming a first dielectric material layer 410". Specifically, in the above step, the semiconductor structure includes the substrate 100, the functional structure layer 200, the first dielectric layer 300, and the first dielectric material layer 410. The first dielectric material layer 410 is formed by depositing a silicon precursor on the surface of the first dielectric layer 300 at a relatively slow first deposition rate. During the deposition of the first dielectric material layer 410, the silicon precursor is deposited in the first recesses 330 and the second recesses 340, such that the deposited first dielectric material layer 410 fills the first recesses 330 and the second recesses 340. Due to the relatively slow first deposition rate of the first dielectric material layer 410, the deposited silicon precursor in this step can fill the first recesses 330 and the second recesses 340 more fully.

FIG. 5 representatively shows a schematic structural diagram of the semiconductor structure in the step of "forming a second dielectric material layer 420". Specifically, in the above step, the semiconductor structure includes the substrate 100, the functional structure layer 200, the first dielectric layer 300, the first dielectric material layer 410, and the second dielectric material layer 420. The second dielectric material layer 420 is formed by depositing a silicon precursor on the surface of the first dielectric material layer 410 at a relatively fast second deposition rate. The relatively fast second deposition rate can increase the yield, which means that a faster deposition rate reduces the time it takes to produce the film layer with a specified thickness, resulting in a shorter process time and higher yield. In addition, the first dielectric material layer 410 and the second dielectric material layer 420 can be formed by depositing the same silicon precursor. In this case, the deposition process of the first dielectric material layer 410 and the second dielectric material layer 420 can be considered as one continuous process step, while dielectric material layers with different thicknesses are deposited at different deposition rates in this step. Thus, the first dielectric material layer 410 and the second dielectric material layer 420 can be considered as jointly forming the second dielectric layer 400 on the surface of the first dielectric layer 300. The second dielectric layer 400 fills the first recesses 330 and the second recesses 340.

Further, in this embodiment, the material of the second dielectric layer 400, i.e., the material of the first dielectric material layer 410 and the second dielectric material layer 420, may include an oxide, such as $SiO_2$, etc. In addition, the material of the second dielectric layer 400 may be, but is not limited to, the same as the material of the first dielectric layer 300.

Further, in this embodiment, the forming process of the second dielectric layer 400, i.e., the forming process of the first dielectric material layer 410 and the second dielectric material layer 420, may include a chemical vapor deposition process.

Further, in this embodiment, in the step of "depositing a silicon precursor at a first deposition rate", the first deposition rate may be 2 nm/s to 8 nm/s, such as 2 nm/s, 4.5 nm/s, 7 nm/s, 8 nm/s, etc. In other embodiments, the first deposition rate may be less than 2 nm/s, or greater than 8 nm/s, such as 1.9 nm/s, 8.5 nm/s, etc., which is not limited to this embodiment.

Further, in this embodiment, in the step of "depositing a silicon precursor at a second deposition rate", the second deposition rate may be 15 nm/s to 40 nm/s, such as 15 nm/s, 25 nm/s, 30 nm/s, 40 nm/s, etc. In other embodiments, the second deposition rate may be less than 15 nm/s, or greater than 40 nm/s, such as 14 nm/s, 42 nm/s, etc., which is not limited to this embodiment, provided that the second deposition rate is greater than the first deposition rate.

Further, in this embodiment, in the step of "forming a first dielectric material layer 410", the first dielectric material layer 410 may have a thickness of 50 nm to 100 nm, such as 50 nm, 60 nm, 85 nm, 100 nm, etc. In other embodiments, the thickness of the first dielectric material layer 410 may be less than 50 nm, or greater than 100 nm, such as 48 nm, 105 nm, etc., which is not limited to this embodiment.

Further, in this embodiment, the material of the silicon precursor may include tetraethyl orthosilicate (TEOS for short, with the chemical formula being $C_8H_{20}O_4Si$).

Further, in this embodiment, in the step of "forming a first dielectric material layer 410", the silicon precursor may be introduced at a first gas flow rate, to participate in the deposition of the first dielectric material layer 410. Moreover, in the step of "forming a second dielectric material layer 420", the silicon precursor may be introduced at a second gas flow rate, to participate in the deposition of the second dielectric material layer 420. The second gas flow rate may be greater than the first gas flow rate.

Further, in this embodiment, in the step of "introducing the silicon precursor at a first gas flow rate", the first gas flow rate may be 2 standard cubic centimeters per minute (sccm) to 5 sccm, such as 2 sccm, 3 sccm, 4.5 sccm, 5 sccm, etc. In other embodiments, the first gas flow rate may also be less than 2 sccm, or may be greater than 5 sccm, such as 1.8 sccm, 5.1 sccm, etc., which is not limited to this embodiment.

Further, in this embodiment, in the step of "introducing the silicon precursor at a second gas flow rate", the second gas flow rate may be 15 sccm to 30 sccm, such as 15 sccm, 18 sccm, 22 sccm, 30 sccm, etc. In other embodiments, the second gas flow rate may also be less than 15 sccm, or greater than 30 sccm, such as 14 sccm, 32 sccm, etc., which is not limited to this embodiment, provided that the second gas flow rate is greater than the first gas flow rate.

Figure 6:
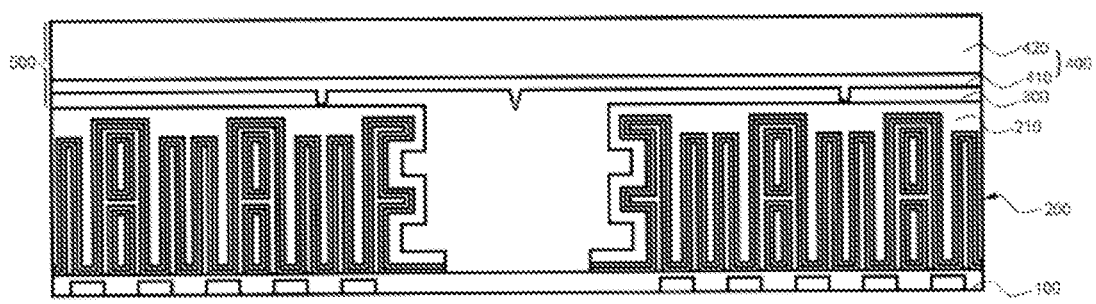

Further, as shown in FIG. 6, in this embodiment, the manufacturing method of a semiconductor structure proposed by the present disclosure may further include the following step:

after forming the second dielectric material layer 420, grinding to remove part of the second dielectric material layer 420, such that the first dielectric material layer 410 and the remaining second dielectric material layer 420 together form the second dielectric layer 400.

FIG. 6 representatively shows a schematic structural diagram of the semiconductor structure in the step of "grinding to remove part of the second dielectric material layer 420". Specifically, in the foregoing step, the semiconductor structure includes the substrate 100, the functional structure layer 200, the first dielectric layer 300, and the second dielectric layer 400; the second dielectric layer 400 in this step specifically includes the first dielectric material layer 410 and the remaining second dielectric material layer 420 after grinding. The grinding thickness of the second dielectric material layer 420 can be determined according to the actual requirements on the thickness of the semiconductor structure. The final remaining dielectric layer 500 includes the first dielectric layer 300 and the second dielectric layer 400. The thickness of the dielectric layer 500 is set according to the requirements of the subsequent process. Since the dielectric layer 500 further needs to be opened subsequently and filled with metal to form wires, the thickness of the retained dielectric layer 500 can be increased if the subsequent process requires long wires. In other words, compared with forming a dielectric layer on the surface of the functional structure layer 200 with a one-step process, an overall thickness of the dielectric layer 500 (including the first dielectric layer 300 and the second dielectric layer 400) formed after two grinding processes in the present disclosure can be approximately the same as the thickness of the above-mentioned dielectric layer, and can be reduced or increased depending on different requirements.

Based on the above detailed description of several exemplary embodiments of the manufacturing method of a semiconductor structure proposed by the present disclosure, an exemplary embodiment of the semiconductor structure proposed by the present disclosure is described below with reference to FIG. 6.

With reference to FIG. 6, in this embodiment, the semiconductor structure proposed by the present disclosure includes at least a substrate 100, a functional structure layer 200, a first dielectric layer 300, and a second dielectric layer 400. Specifically, the functional structure layer 200 is provided on the surface of the substrate 100. The functional structure layer 200 includes a plurality of functional units 210 arranged at intervals; a gap 220 is provided between two adjacent functional units 210; the first dielectric layer 300 is provided in each gap 220 and is located on the surface of the functional structure layer 200; first recesses 330 and second recesses 340 are provided on the surface of the first dielectric layer 300; the second recesses 340 are each located above the corresponding gap 220. The second recesses 340 are formed by exposing voids 320, which are generated during formation of the first dielectric layer 300, in a step of grinding the first dielectric layer 300. The second dielectric layer 400 is provided on the surface of the first dielectric layer 300, and fills the first recesses 330 and the second recesses 340.

In summary, the manufacturing method of a semiconductor structure proposed by the present disclosure includes forming the first dielectric layer on the functional structure layer, grinding the first dielectric layer to remove the particles, and forming the second dielectric layer on the first dielectric layer such that the second dielectric layer completely fills the first recesses. By the above process design, the manufacturing method of a semiconductor structure proposed by the present disclosure can avoid bump and void defects between adjacent functional structure layers, thereby improving the reliability and service life of the semiconductor structure, and achieving the advantages that the process is simple and easy to control.

The present disclosure is described above with reference to several typical implementations. It should be understood that the terms used herein are intended for illustration, rather than limiting. The present disclosure may be specifically implemented in many forms without departing from the spirit or essence of the present disclosure. Therefore, it should be understood that the above embodiments are not limited to any of the above-mentioned details, but should be broadly interpreted according to the spirit and scope defined by the appended claims. Therefore, any changes and modifications falling within the claims or the equivalent scope thereof should be covered by the appended claims.

The invention claimed is:

1. A manufacturing method of a semiconductor structure, comprising:
    providing a substrate, wherein a capacitor functional structure layer is formed on a surface of the substrate, and particles exist on the surface of the capacitor functional structure layer;
    forming a first dielectric layer on the surface of the substrate, wherein the first dielectric layer covers the capacitor functional structure layer;
    grinding to remove part of the first dielectric layer until the particles are exposed, and removing the particles, to form first recesses on a surface of the remaining first dielectric layer; and
    depositing a silicon precursor on the surface of the first dielectric layer at a first deposition rate to form a first dielectric material layer, wherein the first dielectric material layer fills the first recesses;
    depositing the silicon precursor on a surface of the first dielectric material layer at a second deposition rate to form a second dielectric material layer, wherein the second deposition rate is greater than the first deposition rate; and
    grinding to remove part of the second dielectric material layer, such that the first dielectric material layer and the remaining second dielectric material layer together form a second dielectric layer, wherein the second dielectric layer fills the first recesses.

2. The manufacturing method of the semiconductor structure according to claim 1, wherein a material of the first dielectric layer comprises an oxide.

3. The manufacturing method of the semiconductor structure according to claim 2, wherein a forming process of the first dielectric layer comprises a chemical vapor deposition process.

4. The manufacturing method of the semiconductor structure according to claim 1, wherein a material of the second dielectric layer comprises an oxide.

5. The manufacturing method of the semiconductor structure according to claim 4, wherein a forming process of the second dielectric layer comprises a chemical vapor deposition process.

6. The manufacturing method of the semiconductor structure according to claim 1, wherein a grinding process for removing part of the first dielectric layer comprises a chemical mechanical polishing process.

7. The manufacturing method of the semiconductor structure according to claim 1, wherein the remaining first dielectric layer after grinding has a thickness of 100 nm to 200 nm.

8. The manufacturing method of the semiconductor structure according to claim 1, wherein the first deposition rate is 2 nm/s to 8 nm/s.

9. The manufacturing method of the semiconductor structure according to claim 1, wherein the second deposition rate is 15 nm/s to 40 nm/s.

10. The manufacturing method of the semiconductor structure according to claim 1, wherein the first dielectric material layer has a thickness of 50 nm to 100nm.

11. The manufacturing method of the semiconductor structure according to claim 1, wherein in the forming a first dielectric material layer, the silicon precursor is introduced at a first gas flow rate; and in the forming a second dielectric material layer, the silicon precursor is introduced at a second gas flow rate, the second gas flow rate being greater than the first gas flow rate.

12. The manufacturing method of the semiconductor structure according to claim 1, wherein a material of the silicon precursor comprises tetraethyl orthosilicate.

13. The manufacturing method of the semiconductor structure according to claim 11, wherein the first gas flow rate is 2 sccm to 5 sccm.

14. The manufacturing method of the semiconductor structure according to claim 11, wherein the second gas flow rate is 15 sccm to 30 sccm.

15. The manufacturing method of the semiconductor structure according to claim 1, further comprising:
    after forming the second dielectric material layer, grinding to remove part of the second dielectric material layer, such that the first dielectric material layer and the remaining second dielectric material layer together form the second dielectric layer.

16. The manufacturing method of the semiconductor structure according to claim 15, wherein a grinding process for removing part of the second dielectric material layer comprises a chemical mechanical polishing process.

17. The manufacturing method of the semiconductor structure according to claim 1, wherein the capacitor functional structure layer comprises a plurality of functional units arranged at intervals; when the first dielectric layer is formed on the surface of the substrate, the first dielectric layer fills a gap between two adjacent functional units, and a void is formed at a position corresponding to the gap on the surface of the first dielectric layer; when part of the first dielectric layer is removed by grinding, the void is exposed, such that a second recess is formed on the surface of the remaining first dielectric layer; when the second dielectric layer is formed, the second dielectric layer fills the second recess.

* * * * *